United States Patent [19]

Chen

[11] Patent Number: 5,414,613
[45] Date of Patent: May 9, 1995

[54] SOFT SWITCHING ACTIVE SNUBBER FOR SEMICONDUCTOR CIRCUIT OPERATED IN DISCONTINUOUS CONDUCTION MODE

[75] Inventor: Keming Chen, Schenectady, N.Y.
[73] Assignee: REM Technologies, Incorporated, Schenectady, N.Y.
[21] Appl. No.: 110,100
[22] Filed: Aug. 20, 1993
[51] Int. Cl.$^6$ .......................................... H02H 7/125
[52] U.S. Cl. ........................................ 363/52; 363/56; 363/89; 323/210; 323/222
[58] Field of Search ................ 323/205, 207, 210, 220, 323/222, 223, 282; 363/44, 55, 56, 84, 89, 125, 126, 52, 53, 54

[56] References Cited

U.S. PATENT DOCUMENTS

| | | | |
|---|---|---|---|
| 4,268,898 | 5/1981 | Brown | 363/56 |
| 4,533,986 | 8/1985 | Jones | 363/56 |
| 4,607,322 | 8/1986 | Henderson | 363/56 |
| 4,639,849 | 1/1987 | Noworolski et al. | 363/56 |
| 4,730,242 | 3/1988 | Divan | 363/37 |
| 4,761,725 | 8/1988 | Henze | 363/56 |
| 4,772,810 | 9/1988 | Felps | 363/56 |
| 4,864,483 | 9/1989 | Divan | 363/37 |
| 4,899,270 | 2/1990 | Bond | 363/56 |
| 4,977,493 | 12/1990 | Smith | 363/126 |
| 4,998,054 | 3/1991 | Bose et al. | 318/802 |
| 5,001,620 | 3/1991 | Smith | 363/89 |
| 5,014,180 | 5/1991 | Nuechterlein | 363/56 |
| 5,038,267 | 8/1991 | De Doncker et al. | 363/89 |
| 5,055,990 | 10/1991 | Miki et al. | 363/56 |
| 5,075,838 | 12/1991 | Schetzka, II et al. | 363/37 |
| 5,130,917 | 7/1992 | Shekhawat | 363/56 |
| 5,351,179 | 9/1994 | Tsai et al. | 363/53 |

OTHER PUBLICATIONS

Prasad et al. "Active Input Current Waveshaping Method for Three-Phase Diode Rectifiers with Zero Switching Losses", IEEE/IAS Annual Meeting, May 1991, Conf. Record, pp. 932–938.
Harada et al. "Switched Snubber for High Frequency Switching," IEEE, PESC Aug. 1990, pp. 181–188.
Prasad et al., "An Active Power Factor Correction Technique for Three-Phase Diode Rectifiers," IEEE Trans. on Power Elect., vol. 6, No. 1, pp. 83–92, Jan. 1991.
Borle et al, "A Single-Phase, Unity Power Factor, Soft-Switching, Resonant Tank Boost Rectifier," IEEE/IAS Annual Meeting, May, 1991, Conf. Record, pp. 904–910.
Mulkern et al., "A Sinusoidal Line Current Rectifier Using A Zero-Voltage Switching Step-Up Converter," IEEE/IAS Annual Meeting, Jan. 1988, Conf. Record, pp. 767–771.
Chen et al., "A 1.5kW, 200kHz DC—DC Converter Optimized for IGBTs," HFPC Jun. 1991, pp. 265–274.
Borojevic et al., "A Zero-Voltage Switched, Three-Phase PWM Switching Rectifier With Power Factor Correction," HFPC Jun. 1991, pp. 252–264.
Andreycak, Bill, "Active Power Factor Correction Using Zero Current and Zero Voltage Switching Techniques," HFPC Jun. 1991, pp. 46–60.
Simonetti et al., "Single-Switch Three-Phase Power Factor Preregulator Under Variable Switching Frequency and Discontinuous Input Current," IEEE, PESC Jan. 1993, pp. 657–662.

Primary Examiner—Jeffrey L. Sterrett
Attorney, Agent, or Firm—Heslin & Rothenberg

[57] ABSTRACT

A snubber network for a power conversion circuit operated in discontinuous conduction mode includes a snubber capacitor, an isolation diode and an active reset circuit. The snubber capacitor is connected to the output of the isolation diode, both of which are connected across a main switch of the power conversion circuit. The active reset circuit, connected between the input and output of the isolation diode as well as the input and output of a boost diode, is responsive to a reset signal for active resetting of the snubber capacitor within the normal boost cycle of the power conversion circuit. Upon receipt of the reset signal, energy held by the snubber capacitor is recovered by the reset circuit and subsequently transferred to the output of the power conversion circuit with turn-off of the main switch of the power conversion circuit. This occurs contemporaneous with the power conversion circuit's delivery of converted power to its output. With the snubber network, soft switching is provided for both the main switch and a snubber switch within the active reset circuit.

15 Claims, 4 Drawing Sheets

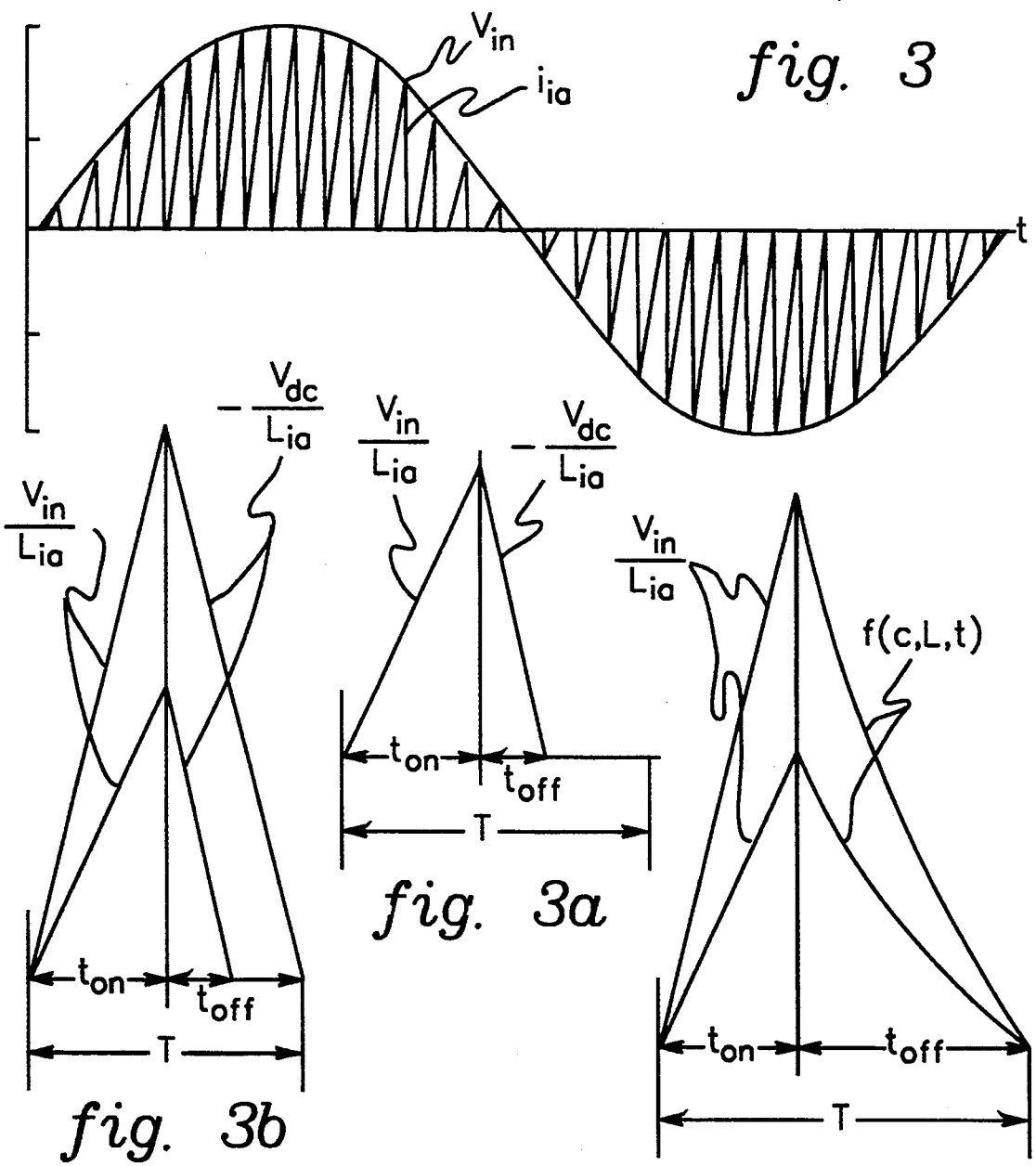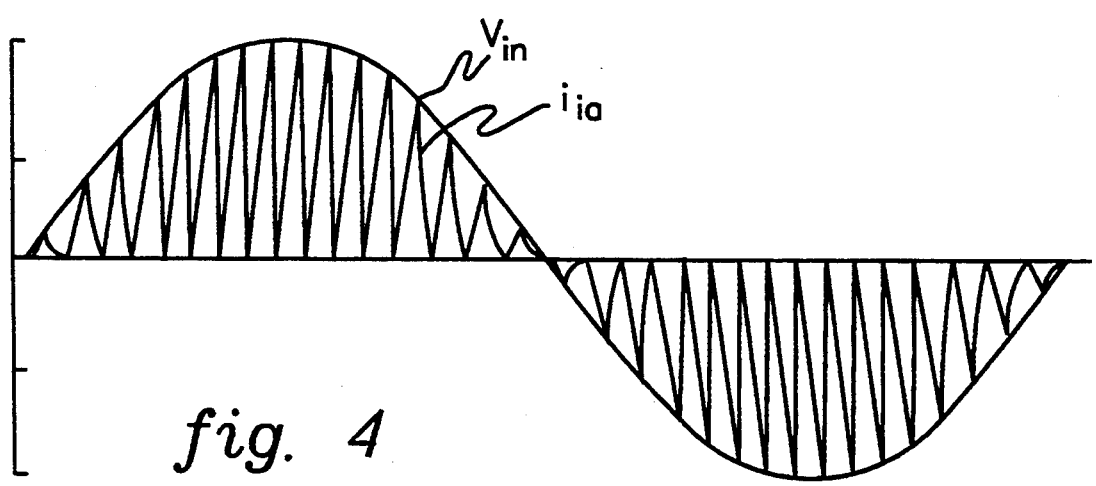

SOFT SWITCHING ACTIVE SNUBBER FOR SEMICONDUCTOR CIRCUIT OPERATED IN DISCONTINUOUS CONDUCTION MODE

TECHNICAL FIELD

The present invention relates in general to snubber circuits for semiconductor devices and, more particularly, to an efficient, soft switching active snubber for a semiconductor switching device of a boost-type power converting circuit operated in discontinuous conduction mode.

BACKGROUND ART

Power converting circuits as known in the art include ac-to-dc rectifier circuits, dc-to-dc converting circuits and ac-to-ac converting circuits (herein sometimes collectively referred to as "power conversion circuits," "power converting circuits," or "converters"). In each such circuit, one or more semiconductor switching devices are coupled between an input and an output of the power converting circuit. The input of the power converting circuit is coupled to a power source, such as a battery, the output of a rectifier circuit, or a three-phase ac source. The output of the power converting circuit is coupled to an electrical load to which the power provided by the power converting circuit is to be delivered. The switching devices of the power converting circuit are selectively controlled to switch on and off to condition the power received from the power source for delivery to the electrical load. For example, an ac-to-ac converting circuit may include a rectifier circuit for converting three-phase ac input into a dc voltage. The switching devices of a three-phase inverter circuit having its input connected to receive dc output of a rectifier circuit are connected and operated to provide a desired three-phase ac output.

The semiconductor switching devices utilized in power converting circuits can include thyristors, transistors, gate turn-off devices, MOSFETs, MCTs, or IGBTs. Power converting circuits typically include a snubber circuit connected across each semiconductor switching device. The snubber circuit operates to limit the rate of change of voltage across the switching device when the device is turned off, i.e., is opened, thereby reducing turn-off power dissipation losses within the switching device. Various types of snubber circuits have been proposed. Although existing snubber circuits serve to reduce losses from switching devices, they often produce a power loss themselves, thereby limiting their application to small power or low frequency circuits. When high frequency and/or high power is desired, loss within a snubber circuit can significantly reduce the power handling capacity of the converter.

To overcome active device switching losses, while enabling operation at higher switching frequencies, soft-switching converters have been developed. In general, there are two types of soft-switching (or resonant) converters: zero-voltage switching and zero-current switching. Zero-voltage switching involves switching an active device when there is zero-voltage thereacross. On the other hand, zero-current switching involves switching an active device when there is zero-current therethrough. Examples of soft-switching converters exist in the open literature, such as: U.S. Pat. Nos. 4,730,242; 4,864,483; and 5,038,267.

Despite developments in soft-switching converter technology, for many applications such converters remain too complex and/or costly, typically requiring the use of multiple active devices. Thus, there exists a need in the semiconductor art for an improved soft-switching, active snubber circuit (e.g., for application to the switching device(s) of a power converting circuit) that operates more efficiently than conventional snubber circuits. The present invention provides such a snubber circuit, which has both zero voltage turn-off switching and zero current turn-on switching.

DISCLOSURE OF INVENTION

Briefly described, the present invention comprises in one aspect a snubber network for a power conversion circuit operated in discontinuous conduction mode. The power conversion circuit has an input for coupling to a source of power and an output for coupling to a load to which converted power is to be delivered. The power conversion circuit further includes a semiconductor element having two main current path electrodes and a control electrode for alternate turn-on and turn-off operation thereof in response to a gating signal at the control electrode for selective conduction of current to the output of the power conversion circuit. The snubber network includes a snubber capacitor having a first terminal and a second terminal and an isolation diode having an input and an output. The input of the isolation diode is connected to a first one of the two main current path electrodes of the semiconductor element and the output of the isolation diode is connected to the first terminal of the snubber capacitor. The second terminal of the snubber capacitor is connected to a second one of the two main current path electrodes of the semiconductor element so that upon turn-off of the semiconductor element the snubber capacitor provides a soft switching characteristic to the element by absorbing energy. An active reset circuit, which is responsive to a given reset signal for resetting the snubber capacitor, is also provided. The active reset circuit connects to the input of the isolation diode, the output of the isolation diode and to an output of a boost diode forming part of the power conversion circuit. Upon receipt of the reset signal, energy held by the snubber capacitor is recovered by the reset circuit, without potential for damage to the semiconductor element, and subsequently transferred to the output of the power conversion circuit with turn-off of the semiconductor element. This occurs simultaneous with the power conversion circuit's normal delivery of converted power at its output.

In one enhanced embodiment, the active reset circuit of the snubber network includes a snubber inductor, having a first terminal and a second terminal, serially connected to the snubber capacitor such that the second terminal of the snubber inductor is connected to the first terminal of the snubber capacitor. A snubber diode, having an input and an output, has its input connected to the first terminal of the snubber inductor and its output connected to the output of the boost diode of the power conversion circuit. A controllable switch operable between on and off states has a first current path electrode connected to the first one of the two main current path electrodes of the semiconductor element and a second current path electrode connected to the commonly connected first terminal of the snubber inductor and input of the snubber diode. The controllable switch further includes a control electrode through which the controllable switch can be selectively operated between the on and off states.

In another aspect, the invention comprises a power conversion network having a boost converter circuit and a snubber network coupled thereto. The boost converter circuit has an input for coupling to a source of power and an output for coupling to a load to which converter power is to be delivered. The boost converter circuit further includes a boost inductor coupled to a boost diode and a boost switching device connected to the input of the boost diode, with the output of the boost diode being connected to the output of the boost converter circuit. The snubber network is coupled across the boost switching device and the boost diode and is connected to a junction defined by the boost switching device's connection to the boost diode. This snubber network includes a snubber capacitor having a first terminal and a second terminal, and an isolation diode, having an input terminal and an output terminal. The input terminal of the isolation diode is connected to the junction between the boost switching device and the boost diode, while the output terminal of the isolation diode is connected to the first terminal of the snubber capacitor and is coupled to the output of the boost diode. The second terminal of the snubber capacitor is connected to the boost switching device such that upon turn-off of the boost switching device, the snubber capacitor provides a soft switching characteristic to the boost switching device by absorbing energy. An active reset circuit responsive to a given reset signal for resetting the snubber capacitor is also provided. The active reset circuit is connected to the junction between the boost switching device and the boost diode, to a junction defined by the output of the isolation diode and the first terminal of the snubber capacitor, and to the output of the boost diode. Upon receipt of the given reset signal, energy held by the snubber capacitor is recovered through the reset circuit, without potential for damage to the boost switching device of the boost converter circuit, for subsequent transfer to the output of the boost converter circuit with turn-off of the boost switching device. This transfer of energy is commensurate with delivery of converted energy at the output of the boost converter circuit.

To restate, the high turn-off loss of an IGBT switch due to current tailing can be substantially reduced by a soft-switching active snubber as set forth herein. In the provided example, the circuit enables a single switch three-phase diode bridge rectifier to be operated at very high switching frequency with a unity power factor and high quality input current. The circuit also simplifies the input filter and thermal design. Furthermore, since the snubber circuit reset operation in accordance with the invention is part of the normal circuit operation, there is virtually no loss of duty cycle. Finally, the snubber capacitor is separated from the main switching device by the isolation diode, hence the snubber capacitor is protected should zero-voltage switching conditions be partially or totally lost under light or no load conditions.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which:

FIG. 3 is a plot of input current and voltage for a conventional converter wherein harmonic distortion of the current ($i_{ia}$) is present;

FIG. 3a is an enlarged view of one sample switching cycle of the current waveform of FIG. 3;

FIG. 3b depicts the sample switching cycle of FIG. 3a for two different input voltage ($V_{in}$) values;

FIG. 4 is a plot of input current ($i_{ia}$) and voltage ($V_{in}$) for a converter circuit pursuant to the present invention;

FIG. 4a is an enlarged view of two sample switching cycles of the current waveform of FIG. 4 wherein input voltage ($V_{in}$) is different between the samples.

BEST MODE FOR CARRYING OUT THE INVENTION

Growing concern over power quality has stimulated demand to apply harmonic control within most equipment. The development of active power factor correction three-phase ac-dc converters has attracted much interest for high power applications in recent years (see E. Wernekinck, et al., "A High Frequency AC/DC Converter with Unity Power Factor and Minimum Harmonics Distortion," IEEE, PESC '1987 Record, pp. 264–270; S. Manias, et al., "Three-Phase Inductor Fed SMR Converter with High Frequency Isolation High Power Density and Improved Power Factor," IEEE PESC '1987 Record, pp. 253–263; and A. R. Prasad, et al., "An Active Power Factor Correction Technique for Three-Phase Diode Rectifiers," IEEE Trans. on Power Electronics, Vol. 6, No. 1, pp. 83–92, 1991).

Figure 1:
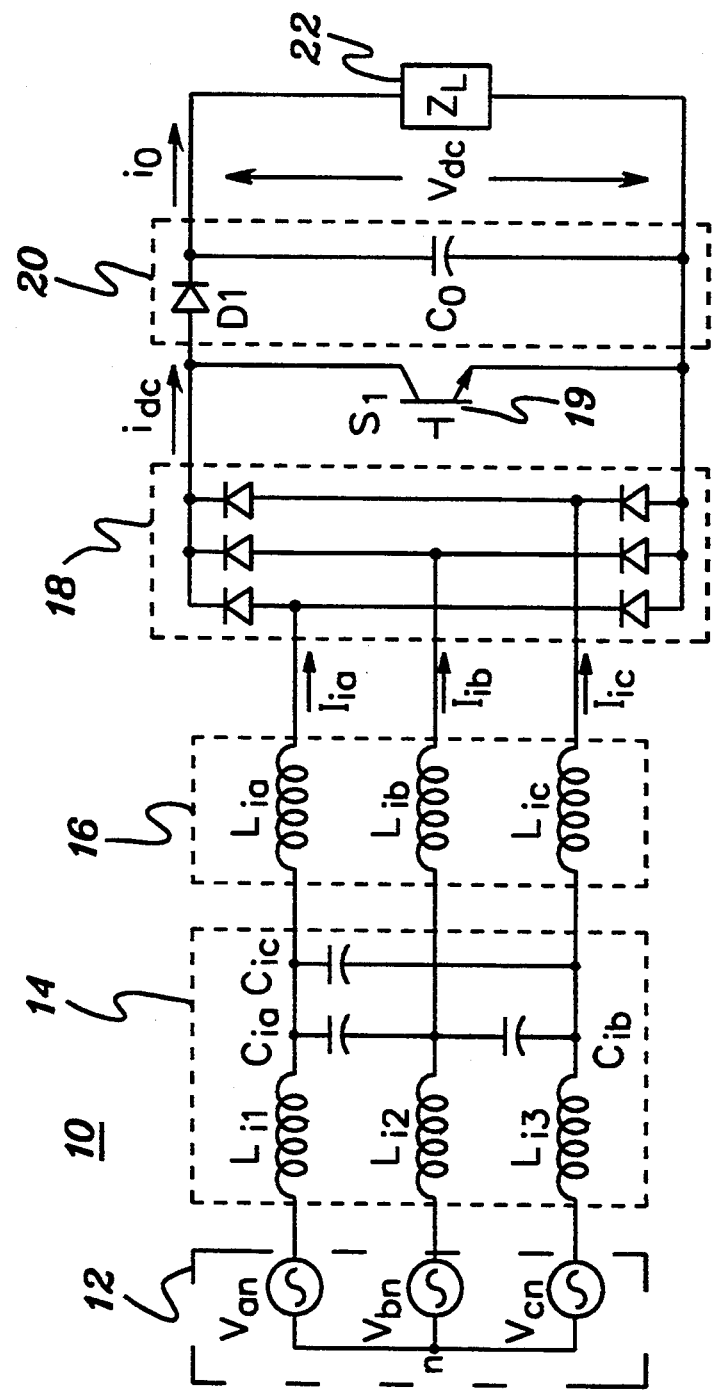
FIG. 1 is a schematic of a conventional single switch unity power factor three-phase diode rectifier.

The single switch three-phase diode bridge ac-dc converter proposed by Prasad et al. shows the most promise in many respects. This circuit, an embodiment of which is depicted in FIG. 1, utilizes only one switching device on the dc side of the rectifier to shape input line current. This results in fewer components and simplified control and drive circuitry (not shown). Furthermore, it eliminates the need for complicated synchronization logic since the line current automatically follows the input voltage without traditional sense and feedback control. The circuit operates at constant switching frequency and the duty cycle is varied for load variations only. However, since the circuit is required to operate in discontinuous mode, the current stress on the switching device (S1) is substantially increased. Also, in order to accommodate a smaller input filter and better input current quality, the power device should switch at a higher frequency.

As noted, a three-phase ac-to-dc converter, generally denoted 10, is depicted in FIG. 1. The three-phase ac-to-dc converter consists of two main power conversion stages. The first stage includes a three-phase ac-to-dc rectifier having an ac source 12, an input filter 14, a boost inductor 16, a three-phase diode rectifier 18, an active power factor correction stage (S1) 19, and a dc link filter capacitor 20. The second stage can be modeled as any type of load ($Z_L$) 22 requiring a regulated or unregulated dc bus, such as general purpose single-phase or three-phase inverters or dc-dc converters with high frequency isolation.

Active wave shaping of the input current waveform is obtained through the use of the three-boost chopper components, namely, inductance ($L_{ia}$) (or $L_{ib}$ or $L_{ic}$), switch (S1), and diode (D1) as shown in FIG. 1. The boost switch (S1) is turned on at a constant frequency. The duty cycle of switch (S1) is varied for load variations only and it is such that the input current is always discontinuous. During the on period of the boost switch all three input ac phases become shorted through inductors ($L_{ia}$, $L_{ib}$, $L_{ic}$), the six rectifier diodes and the boost switch (S1). Consequently, the three-input currents ($i_{ia}$, $i_{ib}$, and $i_{ic}$) begin simultaneously to increase at a rate proportional to the instantaneous values of their respective phase voltages. Moreover, the specific peak current values during each "on" interval are proportional to the average values of the input phase voltages during the same "on" interval. Since each of these voltage average values varies sinusoidally, the input current peaks also vary sinusoidally (see FIG. 3).

The single switch, three-phase diode bridge ac-dc converter 10 of FIG. 1 requires high power and high speed switching devices. Although IGBTs have emerged as ideal candidates for high power and high speed applications, such devices exhibit a current tailing problem that limits maximum operating frequency to about 20 kHz. The use of IGBTs with zero-voltage and/or zero-current switching has resulted in an increase in the switching frequency. However, most such circuits employ a reverse boost inductor current in each switching cycle to achieve a zero-voltage switching condition. This results in the loss of duty cycle. Furthermore, such an operation is not feasible in a single-switch three-phase diode bridge ac-dc converter such as shown in FIG. 1, where the boost inductor is on the ac side of the diode bridge. Since a large snubber capacitor is required to effectively remove the turn-off loss, if IGBTs are used, a zero-voltage switching condition has to be maintained under almost all operation conditions to avoid the discharge of a partially charged snubber capacitor when switching devices are turned on.

A soft-switching active snubber as set forth herein is needed to reduce the switching losses and stresses on the power device, with a goal of increasing switching frequency. The embodiment described below assumes that an IGBT circuit is employed as the main power switching device (S1) in a single-switch three-phase diode bridge ac-dc converter. The invention, however, is equally applicable to any boost-type device operated in discontinuous conduction mode. As described below, the main switch and a snubber switch of a converter in accordance with the present invention are both turned off with zero-voltage switching and turned on with zero-current switching.

Figure 2:
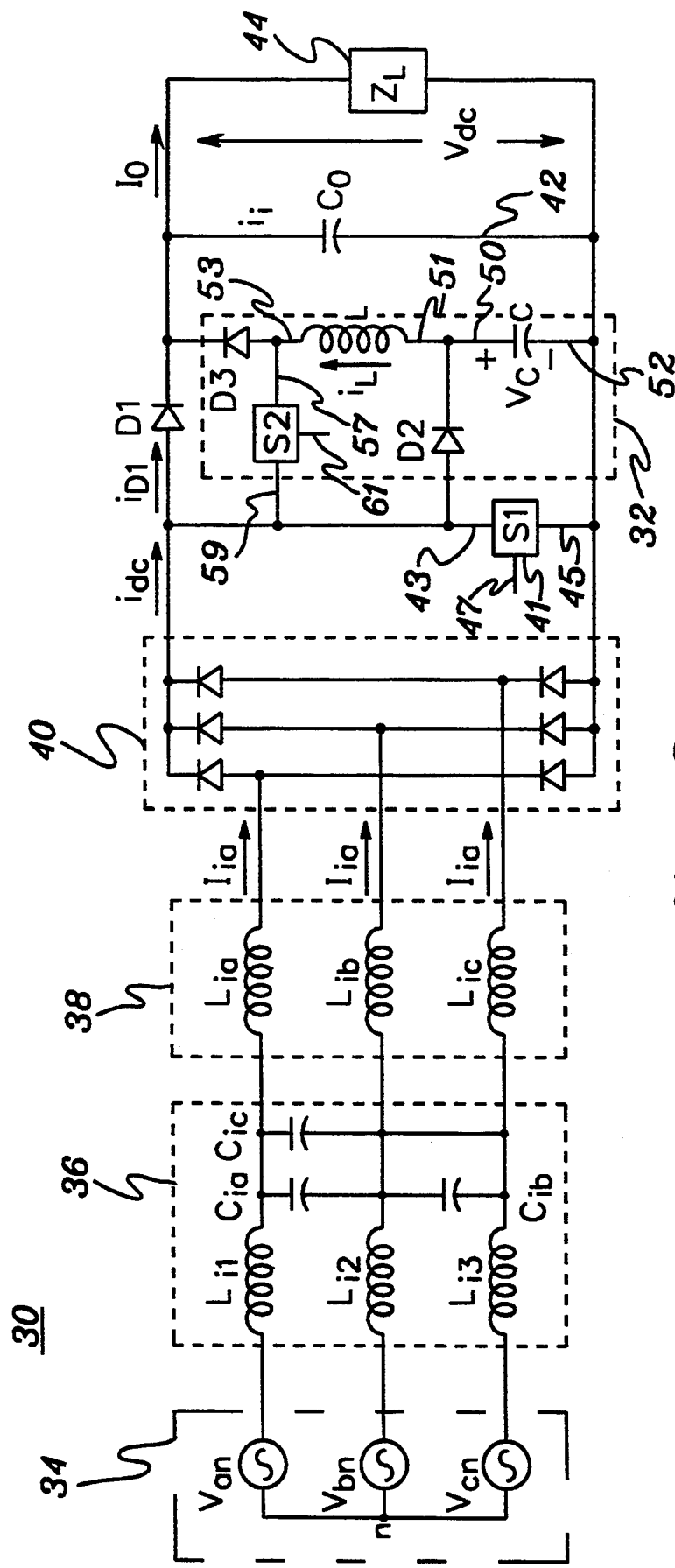
FIG. 2 is a schematic of a three-phase diode rectifier having a soft switching active snubber network pursuant to the present invention.

One embodiment of a single switch three-phase diode bridge ac-dc converter, generally denoted 30, pursuant to the present invention is shown in FIG. 2. Converter 30 includes a soft-switching active snubber network 32 (outlined in phantom) in accordance with the invention. Apart from snubber network 32, the types of components comprising converter 30 are substantially the same as the components described above in connection with converter 10 of FIG. 1. Namely, converter 30 includes an ac source 34, an input filter 36, a boost inductor 38, a three-phase diode rectifier 40, an active power factor correction stage 41, and a dc link filter capacitor 42. The second stage again comprises any type of load ($Z_L$) 44 requiring a regulated or unregulated dc bus.

Figure 5:
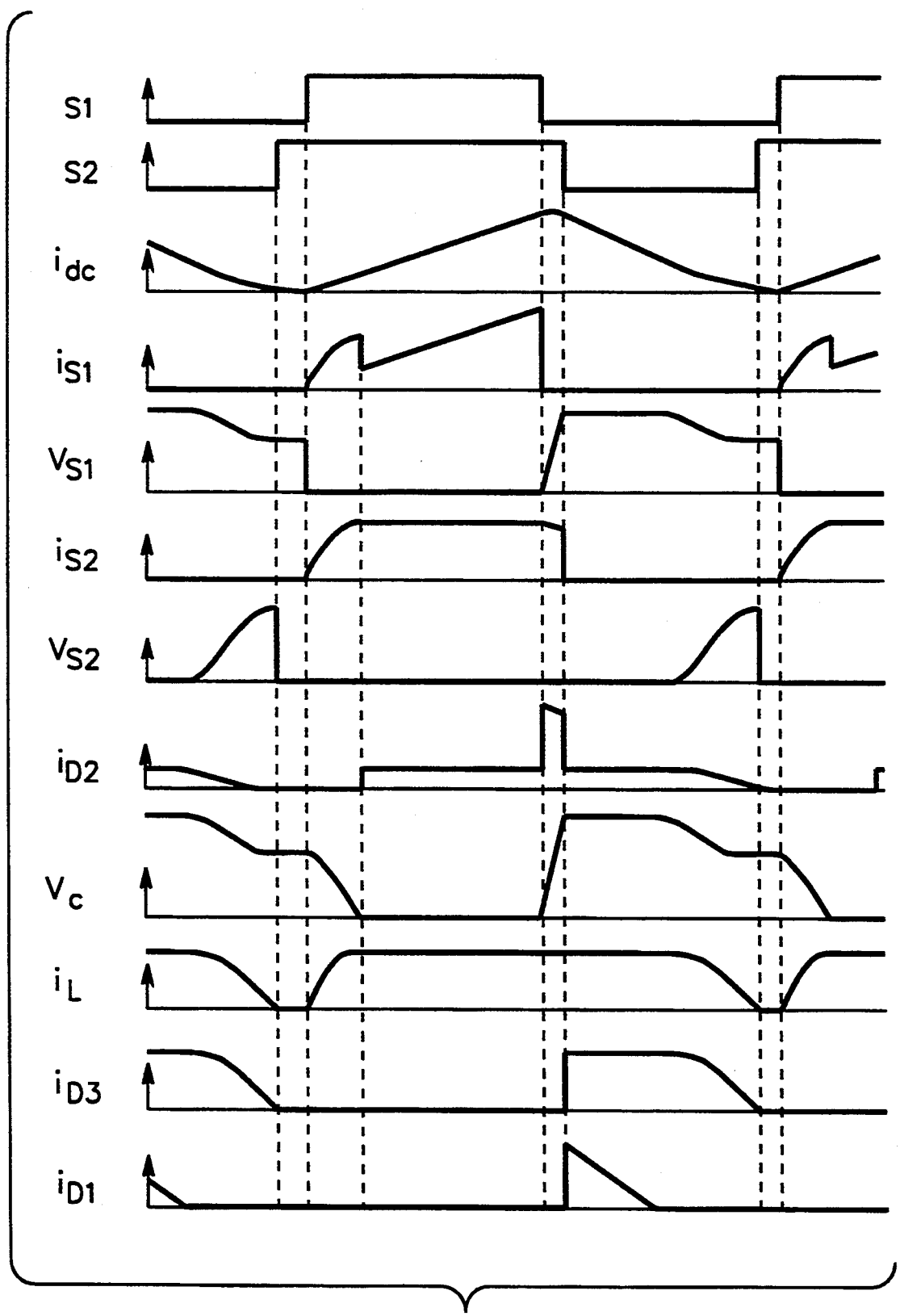
FIG. 5 is a timing diagram illustrating selected current and voltage waveforms within the converter circuit of FIG. 2.

As shown, snubber circuit 32 includes a semiconductor switching element (S2), two diodes (D2), (D3), an inductor (L) and a capacitor (C), and is coupled across diode (D1) and semiconductor switching element (S1). Element (S1) 41 has two main current path electrodes 43 & 45 and a control electrode 47 for alternate turn-on and turn-off operation in response to a given gating signal at the control electrode, e.g., received from conventional control circuitry (not shown). (Sample drive signals for switching elements (S1) and (S2) are shown in FIG. 5.) Capacitor (C) has a first terminal 50 and a second terminal 52, and inductor (L) has a first terminal 53 and a second terminal 51. Capacitor (C) and inductor (L) are commonly connected such that first terminal 50 of capacitor (C) connects with second terminal 51 of inductor (L). Second terminal 52 of capacitor (C) is connected to the second main current path electrode 45 of switching element (S1) 41.

First terminal 53 of inductor (L) connects to one electrode 57 of controllable switch (S2) and an input of diode (D3). The output of diode (D3) is connected to the output terminal of converter 30. The other current path electrode 59 of controllable switch (S2) is connected to the first main current path electrode 43 of controllable switch (S1) 41. A given control signal (see FIG. 5), from the converter's control circuitry (not shown), gates operation of switch (S2) between on and off states via a control input 61. Isolation diode (D2) has an input connected to main current path electrode 43 of semiconductor element 41 and an output connected to the commonly connected second terminal 51 of inductor (L) and first terminal 50 of capacitor (C). In the embodiment depicted, snubber circuit 32 provides soft-switching active snubbing for semiconductor switching element (S1) while converter diode (D1) functions to provide soft-switching active snubbing for controllable switch (S2) of the snubber network.

Traditionally, the function of a snubber circuit is to relieve stress on a main switching device. An added feature of a circuit in accordance with the present invention for power factor correction is that the interaction between the snubber capacitor (C) and the boost inductor(s) ($L_{ia}$, $L_{ib}$, $L_{ic}$) improves the resultant power factor. The current waveform through boost inductor ($L_{ia}$) for a conventional converter is shown in FIG. 3. As depicted, gaps exist between current spikes introducing harmonic distortion into the current waveform. This harmonic distortion can be understood by examining FIG. 3a wherein, by way of example, one switching cycle of the current waveform of FIG. 3 is shown enlarged; where:

T = switching period,
$t_{on}$ = main switch turn-on time,
$t_{off}$ = time for current to reach 0,
$V_{in}/L_{ia}$ = the slope for current rise, and
$-V_{dc}/L_{ia}$ = the slope for current fall. For a constant frequency operation with a regulated output voltage, (T), ($t_{on}$) and ($V_{dc}$) are all constant. Inductance ($L_{ia}$) is also a constant and, therefore, ($-V_{dc}/L_{ia}$) is a constant. FIG. 3b compares current waveforms having different input voltages ($V_{in}$). One approach to reducing harmonic distortion of the input current, presented by Simonetti et al. in an article entitled "Single-Switch Three-Phase Power Factor Preregulator Under Variable Switching Frequency and Discontinuous Input Current," IEEE, PESC '93, pp. 657–662 (1993), is thus to vary the switching frequency to remove the gaps in the current waveform. By varying the switching frequency harmonic distortion is reduced; however, circuit complexity is also significantly increased. FIG. 4 depicts a current waveform for a single switch unity power factor three-phase diode rectifier having a snubber network pursuant to the present invention. Due to the interaction between the snubber circuit (and in particular the snubber capacitor (C)) and the boost inductors ($L_{ia}$, $L_{ib}$, $L_{ic}$), gaps in the current waveform experienced when employing a conventional converter, are reduced. FIG. 4a shows that the current fall slope in a converter in accordance with the present invention is determined by snubber capacitance (C) and inductance of the boost inductors.

Current and voltage waveforms for one boost switching cycle of converter 30 are illustrated in FIG. 5. These waveforms clearly depict the claimed zero-voltage switching and zero-current switching characteristics and operation of a boost-type device in accordance with the present invention. Briefly explained, assume that the initial snubber inductor current $i_L$ is zero, snubber switch (S2) is on, and snubber capacitor (C) has a voltage $V_C$ which is less than the output voltage $V_{dc}$ but greater than the input voltage $V_{in}$. The main power switch (S1) is turned on at zero-current switching since the dc link current $I_{dc}$ is always discontinuous. Snubber capacitor (C) discharges through snubber inductor (L), snubber switch (S2) and main switch (S1) until snubber capacitor voltage $V_C$ equals zero, after which isolation diode (D2) conducts. The inductor current $i_L$ then free wheels through isolation diode (D2) and snubber switch (S2). Isolation diode (D2) and capacitor (C) provide zero-voltage switching when main switch (S1) turns off, i.e., capacitor (C) absorbs energy by charging when switch (S1) is turned "off". Once snubber capacitor (C) is charged up to the output voltage $V_{dc}$, the capacitor voltage $V_C$ is clamped at the output voltage $V_{dc}$ by converter diode (D1). Snubber switch (S2) can then be turned "off" at zero voltage, recovering inductor (L) energy to the converter's output. Soft switching, active snubbing for snubber switch (S2) is provided by converter diode (D1). Once the energy is fully recovered from the snubber network, controllable switch (S2) is switched "on" and the next boost switching cycle begins when main switch (S1) is turned "on".

The high turn-off loss of an IGBT switch due to current tailing can be substantially reduced by a soft-switching active snubber as set forth above. The circuit and operation presented enable a single switch three-phase diode bridge rectifier to be operated at very high switching frequency with a unity power factor and high quality input current. The circuit also simplifies the input filter and thermal design. Furthermore, since the snubber circuit reset operation becomes part of the normal circuit operation, there is virtually no loss of duty cycle. Finally, the snubber capacitor is separated from the main switching device by the isolation diode, hence the snubber capacitor is isolated should zero-voltage switching conditions become partially or totally lost under light or no load conditions.

Although a specific embodiment of the present invention has been illustrated in the accompanying drawings and described in the foregoing detailed description, it will be understood that the invention is not limited to the particular embodiment described herein, but is capable of numerous rearrangements, modifications and substitutions without departing from the scope of the invention. The following claims are intended to encompass all such modifications.

I claim:

1. A snubber network for a power conversion circuit operated in discontinuous conduction mode, the power conversion circuit having an input for coupling to a source of power and an output for coupling to a load to which converted power is to be delivered, the power conversion circuit further including a semiconductor element (S1) having two main current path electrodes and a control electrode for alternate turn-on and turn-off operation thereof in response to a given gating signal at the control electrode for selective conduction of current through the power conversion circuit, said snubber network comprising:

a snubber capacitor (C) having a first terminal and a second terminal;

an isolation diode (D2) having an input and an output, said input of said isolation diode (D2) being connected to a first one of the two main current path electrodes of the semiconductor element (S1) and said output of said isolation diode (D2) being connected to said first terminal of said snubber capacitor (C), said second terminal of said snubber capacitor (C) being connected to a second one of the two main current path electrodes of the semiconductor element (S1) such that upon turn-off of the semiconductor element (S1) said snubber capacitor (C) provides a soft-switching characteristic to the semiconductor element (S1) by absorbing energy; and an active reset circuit (S2, L, D3) responsive to a given reset signal for resetting of said snubber capacitor (C), said active reset circuit being connected to a first junction defined as said input of said isolation diode (D2) connected to the first one of the two main current path electrodes of the semiconductor element (S1) and to a second junction defined as said output of said isolation diode (D2) connected to said first terminal of said snubber capacitor (C) such that upon receipt of said reset signal energy held by said snubber capacitor (C) is fully recovered by said active reset circuit, without potential for damage to the semiconductor element (S1), for subsequent transfer to the output of the power conversion circuit with turn-off of the semiconductor element (S1) commensurate with the power conversion circuit's delivery of converted power to its output.

2. The snubber network of claim 1, wherein the semiconductor element (S1) of the power conversion circuit comprises one of an IGBT switch and an MCT switch.

3. The snubber network of claim 1, wherein the power conversion circuit operated in discontinuous conduction mode has a substantially constant boost switching cycle and wherein said active reset circuit of said snubber network functions within the substantially constant boost switching cycle of the power conversion circuit.

4. The snubber network of claim 1, wherein said active reset circuit includes a reset switching element (S2) and wherein said snubber circuit is connected to the power conversion circuit such that reset switching element (S2) has a soft switching characteristic upon turn-off.

5. The snubber network of claim 4, wherein the power conversion circuit includes a boost diode and wherein said snubber circuit is connected to the power conversion circuit such that said boost diode provides the soft switching characteristic to said reset switching element (S2) upon turn-off.

6. The snubber network of claim 4, wherein said active reset circuit further includes a snubber inductor (L) and a snubber diode (D3) connected in series between said first terminal of said snubber capacitor (C) and the output of the power conversion circuit such that said reset switching element (S2) is connected between the first junction defined by the input of said isolation diode (D2) connected to the first one of the two main current path electrodes of the semiconductor element (S1) and a series junction defined by the series connection of said snubber inductor (L) and said snubber diode (D3).

7. The snubber network of claim 1, wherein the power conversion circuit comprises an ac-dc power converter having a rectifier with an ac side and a dc side, and further having a boost inductor on said ac side of the rectifier and an active power factor correction on the dc side of the rectifier, the active power factor correction comprising the semiconductor element (S1), and wherein said snubber network is connected to the power conversion circuit such that said snubber network is associated with the active power factor correction on the dc side of the rectifier and such that said snubber network provides said soft switching characteristic to the semiconductor element (S1) without employing a reverse current through the boost inductor.

8. A snubber network for a power conversion circuit operated in discontinuous conduction mode, the power conversion circuit having an input for coupling to a source of power and an output for coupling to a load to which converted power is to be delivered, the power conversion circuit further including a first semiconductor element (S1) having two main current path electrodes and a control electrode for alternate turn-on and turn-off operation thereof in response to a given gating signal at the control electrode, and a second semiconductor element (D1) connected to the first semiconductor element (S1), the second semiconductor element (D1) having an input electrode and an output electrode and operating to turn-on and turn-off in response to a bias voltage thereacross for selective conduction of current through the power conversion circuit, the first semiconductor element (S1) and the second semiconductor element (D1) being connected such that a first one of the two main current path electrodes of the first semiconductor element (S1) is connected to the input electrode of the second semiconductor element (D1), said snubber network comprising:

a snubber capacitor (C) having a first terminal and a second terminal;

a snubber inductor (L) having a first terminal and a second terminal, said snubber inductor (L) and said snubber capacitor (C) being serially connected such that said first terminal of said snubber capacitor (C) is connected to said second terminal of said snubber inductor (L);

a snubber diode (D3) having an input and an output, said input of said snubber diode (D3) being connected to said first terminal of said snubber inductor (L) and said output of said snubber diode (D3) being coupled to the output electrode of the second semiconductor element (D1) of the power conversion circuit, and said second terminal of said snubber capacitor (C) being connected to a second one of the two main current path electrodes of the first semiconductor element (S1) such that said serially connected snubber capacitor (C) and snubber inductor (L) and said snubber diode (D3) are coupled across the connected first semiconductor element (S1) and second semiconductor element (D1) of the power conversion circuit;

a controllable switch (S2) operable between on and off states and having a first current path electrode connected to the first one of the two main current path electrodes of the first semiconductor element (S1) and a second current path electrode connected to a first junction defined by said first terminal of said snubber inductor (L) connected to said input of said snubber diode (D3), said controllable switch (S2) further including a control electrode through which said controllable switch can be selectively operated between said on and off states; and an isolation diode (D2) having an input and an output, said input of said isolation diode (D2) being connected to the first one of the two main current path electrodes of the first semiconductor element (S1) and said output of said isolation diode (D2) being connected to said commonly connected second terminal of said snubber inductor (L) and said first terminal of said snubber capacitor (C), whereby said snubber network provides soft switching active snubbing for the first semiconductor element (S1), while the second semiconductor element (D1) provides soft switching for said controllable switch (S2) of said snubber network when said snubber network is connected within the power conversion circuit and the power conversion circuit is operated in discontinuous conduction mode.

9. The snubber network of claim 8, wherein the power conversion circuit comprises a single switch unity power factor three-phase diode rectifier including a rectifier with an ac side and a dc side, and a boost inductor connected on the ac side of the rectifier and an active power factor correction on the dc side of the rectifier, the active power factor correction comprising the semiconductor element (S1) and the semiconductor element (D1), and wherein said snubber network connects to the power conversion circuit such that said snubber network is associated with the active power factor correction on the dc side of the rectifier and such that said snubber network provides said soft switching characteristic to the semiconductor element (S1) without employing a reverse current through the boost inductor of the power conversion circuit.

10. The snubber network of claim 8, wherein the power conversion circuit operated in discontinuous conduction mode has a substantially constant boost switching cycle and wherein said snubber network functions within a substantially constant boost switching cycle of the power conversion circuit.

11. A power conversion network comprising:

a boost converter circuit having an input for coupling to a source of power and an output for coupling to a load to which converted power is to be delivered, said boost converter circuit further having a boost inductor ($L_{ia}$ ... ) coupled to a boost diode (D1) and further having a boost switching device (S1) connected to an input of the boost diode (D1), an output of the boost diode (D1) being connected to the output of the boost converter circuit; and a snubber network coupled across the boost switching device (S1) and the boost diode (D1), and connected to a junction defined by the boost switching device (S1) connected to the boost diode (D1), said snubber network including:

a snubber capacitor (C) having a first terminal and a second terminal, an isolation diode (D2) having an input terminal and an output terminal, said input terminal of said isolation diode (D2) being connected to the junction between the boost switching device (S1) and the boost diode (D1) and said output terminal of said isolation diode (D2) being connected to said first terminal of said snubber capacitor (C) and coupled to the output of the boost diode (D1), said second terminal of said snubber capacitor (C) being connected to the boost switching device (S1) such that upon turn-off of the boost switching device (S1) said snubber capacitor (C) provides a soft-switching characteristic to the boost switching device (S1) by absorbing energy, and an active reset circuit (S2, L, D3) responsive to a given reset signal for resetting of the snubber capacitor (C), said active reset circuit being connected to the junction between the boost switching device (S1) and the boost diode (D1), and to a junction defined by said output of the isolation diode (D2) connected to said first terminal of said snubber capacitor (C), and to the output of the boost diode (D1) such that upon receipt of the given reset signal energy held by the snubber capacitor (C) is recovered through the reset circuit, without potential for damage to the boost switching device (S1) of the boost converter circuit, for subsequent transfer to the output of the boost converter circuit with turn-off of the boost switching device (S1) commensurate with delivery of converted power at the output of the boost converter circuit.

12. The power conversion network of claim 11, wherein the boost converter circuit is operated in discontinuous conduction mode and has a substantially constant boost switching cycle, and wherein said active reset circuit of said snubber network functions within the substantially constant boost switching cycle of the boost converter circuit.

13. The power conversion network of claim 11, wherein said active reset circuit includes a reset switching element (S2) and wherein said snubber circuit is connected to the power conversion circuit such that reset switching element (S2) has a soft switching characteristic upon turn-off.

14. The power conversion network of claim 13, wherein said snubber network is connected to said boost converter circuit such that said boost diode (D1) provides the soft switching characteristic to said reset switching element (S2) upon turn-off.

15. The power conversion network of claim 13, wherein said active reset circuit further includes a snubber inductor (L) and a snubber diode (D3) connected in series between said first terminal of said snubber capacitor (C) and the output of the boost converter circuit such that said reset switching element (S2) is connected across the junction between the boost switching device (S1) and the boost diode (D1) and a series junction defined by the series connection of said snubber inductor (L) and said snubber diode (D3), whereby recovered energy is transferred from said active reset circuit to the output of the boost converter circuit without employing a reverse current through the boost inductor of the boost converter circuit.

* * * * *